United States Patent
Loccufier et al.

(10) Patent No.: US 9,482,954 B2
(45) Date of Patent: Nov. 1, 2016

(54) LITHOGRAPHIC PRINTING PLATE PRECURSOR

(71) Applicant: AGFA GRAPHICS NV, Mortsel (BE)

(72) Inventors: Johan Loccufier, Mortsel (BE); Marin Steenackers, Mortsel (BE); Sam Verbrugghe, Mortsel (BE); Kristof Heylen, Mortsel (BE)

(73) Assignee: AGFA GRAPHICS NV, Mortsel (BE)

( * ) Notice: Subject to any disclaimer, the term of this patent is extended or adjusted under 35 U.S.C. 154(b) by 0 days.

(21) Appl. No.: 14/889,884

(22) PCT Filed: Jun. 12, 2014

(86) PCT No.: PCT/EP2014/062227
§ 371 (c)(1),
(2) Date: Nov. 9, 2015

(87) PCT Pub. No.: WO2014/198823
PCT Pub. Date: Dec. 18, 2014

(65) Prior Publication Data
US 2016/0070173 A1 Mar. 10, 2016

(30) Foreign Application Priority Data
Jun. 14, 2013 (EP) .................... 13171975

(51) Int. Cl.
G03F 7/40 (2006.01)
G03F 7/11 (2006.01)
B41N 1/08 (2006.01)
B41N 3/08 (2006.01)
G03F 7/20 (2006.01)
G03F 7/027 (2006.01)
G03F 7/038 (2006.01)
B41C 1/10 (2006.01)
G03F 7/32 (2006.01)

(52) U.S. Cl.
CPC ........... *G03F 7/2055* (2013.01); *B41C 1/1008* (2013.01); *B41N 3/08* (2013.01); *G03F 7/027* (2013.01); *G03F 7/038* (2013.01); *G03F 7/325* (2013.01); *B41C 2210/04* (2013.01); *B41C 2210/06* (2013.01); *B41C 2210/08* (2013.01); *B41C 2210/22* (2013.01)

(58) Field of Classification Search
CPC .... G03F 7/0392; G03F 7/2055; G03F 7/325; G03F 7/038; B41C 2210/04; B41C 2210/22; B41C 2210/08; B41C 2210/06; B41C 1/1008; B41N 3/08
See application file for complete search history.

(56) References Cited

U.S. PATENT DOCUMENTS

| 4,782,005 A | 11/1988 | Eklund et al. |
| 5,032,486 A * | 7/1991 | Barlow ................. G03F 7/0285 430/199 |
| 7,279,255 B2 | 10/2007 | Tao et al. |
| 8,329,383 B2 | 12/2012 | Memetea et al. |
| 2004/0146804 A1* | 7/2004 | Shiraishi ................... G03F 7/11 430/302 |
| 2008/0311520 A1 | 12/2008 | Yu et al. |
| 2009/0142702 A1 | 6/2009 | Ray et al. |
| 2009/0186299 A1 | 7/2009 | Tao et al. |
| 2016/0116841 A1* | 4/2016 | Steenackers .......... B41C 1/1008 430/283.1 |

FOREIGN PATENT DOCUMENTS

| EP | 0 919 868 A1 | 6/1999 |
| EP | 1 048 981 A1 | 11/2000 |
| EP | 1 288 720 A1 | 3/2003 |
| EP | 2 883 699 A1 * | 6/2015 |
| WO | WO 2014/198820 A1 * | 12/2014 |
| WO | WO 2015/086659 A1 * | 6/2015 |

OTHER PUBLICATIONS

Official Communication issued in International Patent Application No. PCT/EP2014/062227, mailed on Aug. 27, 2014.
Steenackers et al., "A Lithographic Printing Plate Precursor", U.S. Appl. No. 14/889,885, filed Nov. 9, 2015.
Steenackers et al., "A Lithographic Printing Plate Precursor", U.S. Appl. No. 15/037,332, filed May 18, 2016.

* cited by examiner

*Primary Examiner* — Cynthia Hamilton
(74) *Attorney, Agent, or Firm* — Keating and Bennett, LLP

(57) ABSTRACT

A negative-working lithographic printing plate precursor includes a support and a coating containing a photopolymerisable layer; characterized in that the coating includes a compound including at least one moiety having a structure according to Formula (I) at a level above 10% wt and below 40% wt relative to the total dry weight of the ingredients of the coating:

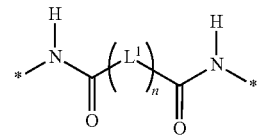

Formula I wherein
n represents an integer equal to 0 or 1;
$L^1$ represents a divalent linking group;
with the proviso that the carbonyl groups in Formula (I) are bonded to a carbon atom.

6 Claims, No Drawings

LITHOGRAPHIC PRINTING PLATE PRECURSOR

BACKGROUND OF THE INVENTION

1. Field of the Invention

The present invention relates to a negative-working lithographic printing plate precursor comprising a novel compound.

2. Description of the Related Art

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

The so-called "analogue" printing plates are generally obtained by first applying a so-called computer-to-film (CtF) method, wherein various pre-press steps such as typeface selection, scanning, color separation, screening, trapping, layout and imposition are accomplished digitally and each color selection is transferred to graphic arts film using an imagesetter. After processing, the film can be used as a mask for the exposure of an imaging material called plate precursor and after plate processing, a printing plate is obtained which can be used as a master. Since about 1995, the so-called "computer-to-plate" (CtP) method has gained a lot of interest. This method, also called "direct-to-plate", bypasses the creation of film because the digital document is transferred directly to a printing plate precursor by means of a platesetter. A printing plate precursor for CtP is often called a digital plate.

The support of the lithographic printing plates are typically aluminum supports which have a hydrophilic surface or on which a hydrophilic layer has been provided. This hydrophilic surface and/or layer should improve the water acceptance of the non-printing areas of a lithographic printing plate and the repulsion of the printing ink in these areas. During developing the soluble portions of the coating should be easily removed whereby the surface of the support remains residue-free so that clean background areas are obtained during printing.

Digital plates can roughly be divided in three categories:
(i) silver plates, working according to the silver salt diffusion transfer mechanism;
(ii) photopolymer plates containing a photopolymerisable composition that hardens upon exposure to light and
(iii) thermal plates of which the imaging mechanism is triggered by heat or by light-to-heat conversion.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light. Photopolymer plate precursors can be sensitized to blue, green or red light i.e. wavelengths ranging between 450 and 750 nm, to violet light i.e. wavelengths ranging between 350 and 450 nm or to infrared light i.e. wavelengths ranging between 750 and 1500 nm. Optionally, the exposure step is followed by a heating step to enhance or to speed-up the polymerization and/or crosslinking reaction. The presslife of photopolymer plates is related to the cohesive strength within the polymerized photolayer. The higher the cohesive strength, the higher the presslife. The cohesive strength can preferably be improved by increasing the crosslinking degree and/or by supramolecular non-covalent interactions such as H-bonding, Van der Waals interactions and dipole-dipole interactions.

In general, a toplayer or protective overcoat layer over the imageable layer is required to act as an oxygen barrier to provide the desired sensitivity to the plate. A toplayer typically includes water-soluble or water-swellable polymers such as for example polyvinylalcohol. Besides acting as barrier for oxygen, the toplayer should best be easily removable during processing and be sufficiently transparent for actinic radiation, e.g. from 300 to 450 nm or from 450 to 750 nm or from 750 to 1500 nm.

The classical work flow of photopolymer plates involves first an exposure step of the photopolymer printing plate precursor in a violet or infrared platesetter, followed by an optional pre-heat step, a wash step of the protective overcoat layer, an alkaline developing step, and a rinse and gum step. Over the past years, there is a clear evolution in the direction of a simplified work flow where the pre-heat step and/or wash step are eliminated and where the processing and gumming step are carried out in one single step. However, it is known that the developing step becomes much more critical when the alkaline developer is replaced by a gum solution with a pH below 8. For example, the hydrophilic polymers in the protective overcoat layer result in a problematic viscosity increase of the gum solution limiting the exhaustion behavior of the plate. Therefore, besides the need to reduce material cost or to avoid the investment of additional coating equipment, there is a high interest in the industry to eliminate the protective overcoat layer present on photopolymer plates. The elimination of the toplayer however negatively impacts the sensitivity and/or presslife of the printing plate.

EP 919 868 discloses a positive type image forming material comprising a polymer (A) containing a phenolic hydroxyl group which is soluble in an aqueous alkaline solution and a light and heat decomposing compound (B) which suppresses the solubility of polymer (A) and a crosslinkable compound (C) which increases the solubility-suppressing effect of compound (B).

U.S. Pat. No. 4,782,005 discloses a radiation sensitive composition comprising an acrylic or methacrylic acid ester, a photoinitiator, and a small amount of the additive N,N'-diorgano dicarboxamide. The radiation sensitive composition is sensitive to ultraviolet light and the N,N'-diorgano dicarboxamide is present in the composition in a minor amount ranging between 1 and 10% wt.

U.S. Pat. No. 7,279,255 discloses a thermal photopolymer plate without a toplayer nor need for a preheat step which has a good shelf life because of the incorporation of a specified poly(alkylene glycol) primary additive into the coating of the plate.

US 2009/0186299 describes a single-layer thermal photopolymer plate where the imageable element includes an organic adhesion promoter having an ethylenically unsaturated carbon-carbon double bond connected to an alkoxysilyl or hydroxysilyl group.

U.S. Pat. No. 8,329,383 discloses a light sensitive printing plate which require no protective overcoat layer nor a preheat step and which includes carboxylamino compounds as oxygen scavenger and shelf life stabilizer.

US 2009/0142702 discloses a method for making a light sensitive, negative-working photopolymer printing plate which is gum processable by including in the coating a specific compound including two hydroxyl groups.

Although many attempts have been made in the art to provide single-layer photopolymer printing plates without any loss in sensitivity and plate performance, there is still an urgent need to improve the lithographic properties such as for example sensitivity and presslife of such overcoat-free printing plates.

SUMMARY OF THE INVENTION

It is an object of the present invention to provide a negative-working lithographic printing plate precursor including a photopolymerisable layer which provides a printing plate with excellent lithographic properties in terms of both sensitivity and presslife.

The object of the present invention is realized by claim 1, i.e. a negative-working lithographic printing plate precursor comprising a support having a hydrophilic surface or which is provided with a hydrophilic layer, and a coating including a photopolymerisable layer, characterised in that the coating comprises a compound including at least one moiety having a structure according to Formula (I):

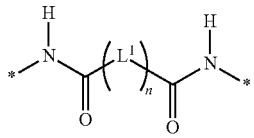

wherein
n represents an integer equal to 0 or 1;
$L^1$ represents a divalent linking group; and
* denotes the linking positions to the rest of the structure;
and wherein the compound according to Formula I is present in an amount above 10% wt and below 40% wt relative to the total dry weight of the ingredients of the coating,
with the proviso that the carbonyl groups in Formula (I) are bonded to a carbon atom.

We have surprisingly found that coatings including a compound containing the moiety according to Formula (I) at a level varying above 10% wt and below 40% wt relative to the total dry weight of the ingredients of the coating result, even without a protective overcoat layer, in printing plates with an excellent sensitivity and an excellent presslife.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE INVENTION

The compound according to a preferred embodiment of the present invention includes at least one moiety having a structure according to Formula (I):

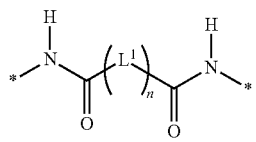

wherein
n represents an integer equal to 0 or 1;
$L^1$ represents a divalent linking group and
* denote the linking positions to the rest of the structure, with the proviso that the carbonyl groups in Formula (I) are bonded to a carbon atom.

The compound according to the present invention is further also referred to herein as "the inventive compound".

The compound according to the present invention can be a monomer, an oligomer (i.e. a structure including a limited amount of monomers such as two, three or four repeating units) or a polymer (i.e. a structure including more than four repeating units). The compound according to the present invention may contain one moiety according to Formula (I), preferably two to 150 moieties according to Formula (I), more preferably two to 100 moieties according to Formula (I) and most preferably two, three or four moieties according to Formula (I).

The divalent linking group $L^1$ is preferably selected from an optionally substituted alkylene, cycloalkylene, arylene, or heteroarylene, —O—, —CO—, —CO—O—, —O—CO—, —CO—NH—, —NH—CO—, —NH—CO—O—, —O—CO—NH—, —NH—CO—NH—, —NH—CS—NH—, —CO—NR'—, —NR"—CO—, —NH—CS—NH—, —SO—, —SO$_2$—, —SO$_2$—NH—, —NH—SO$_2$—, —CH=N—, —NH—NH—, —N$^+$(CH$_3$)$_2$—, —S—, —S—S—, and/or combinations thereof, wherein R' and R" each independently represent an optionally substituted alkyl, aryl, or heteroaryl. The substituents optionally present on the alkylene, the cyloalkylene, the arylene or the heteroarylene group may be represented by an alkyl group such as a methyl, ethyl, propyl or isopropyl group, substituents including for example oxygen or sulfur; a halogen such as a fluorine, chlorine, bromine or iodine atom; a hydroxyl group; an amino group; an alkoxy group such as a methoxy or ethoxy group or a (di)alkylamino group.

More preferably, the divalent linking group $L^1$ is a divalent aliphatic group including straight or branched carbon chain(s) or alicyclic, non-aromatic ring(s). Optionally the aliphatic linking group may contain substituents including for example oxygen or sulfur; alkyl groups such as a methyl, ethyl, propyl or isopropyl group and halogens such as a fluorine, chlorine, bromine or iodine atom.

Most preferably, the linking group $L^1$ represents an optionally substituted alkylene or cycloalkylene group. The substituents optionally present on the alkylene or cycloalkylene group may be represented by an alkyl group such as a methyl, ethyl, propyl or isopropyl group or a halogen such as a fluorine, chlorine, bromine or iodine atom.

Most preferably, the linking group $L^1$ represents an optionally substituted alkylene or cycloalkylene group. The substituents optionally present on the alkylene or cycloalkylene group may be represented by an alkyl group such as a methyl, ethyl, propyl or isopropyl group or a halogen such as a fluorine, chlorine, bromine or iodine atom.

The compound according to the present invention, is preferably represented by Formula (II):

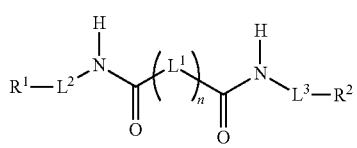

wherein
R¹ and R² independently represent a terminal group;
n represents an integer equal to 0 or 1;
L² and L³ independently represent a divalent linking group, and L¹ represents a divalent linking group as described above for Formula (I), with the proviso that the carbonyl groups in Formula (II) are bonded to a carbon atom.

The terminal groups R¹ and R² are preferably represented by hydrogen, an optionally substituted alkyl or cycloalkyl group, an optionally substituted aryl group, an optionally substituted aralkyl group or an optionally substituted heteroaryl group.

Suitable alkyl groups include 1 or more carbon atoms such as for example $C_1$ to $C_{22}$-alkyl groups, more preferably $C_1$ to $C_{12}$-alkyl groups and most preferably $C_1$ to $C_6$-alkyl groups. The alkyl group may be lineair or branched such as for example methyl, ethyl, propyl (n-propyl, isopropyl), butyl (n-butyl, isobutyl, t-butyl), pentyl, 1,1-dimethyl-propyl, 2,2-dimethylpropyl and 2-methyl-butyl, or hexyl.

Suitable cycloalkyl groups are non-aromatic, homocyclic groups containing carbon atoms and may be monocyclic- or polycyclic. Examples include cyclopentyl, cyclohexyl or adamantyl.

Suitable aryl groups include for example phenyl, naphthyl, benzyl, tolyl, ortho-meta- or para-xylyl, anthracenyl or phenanthrenyl.

Suitable aralkyl groups include for example phenyl groups or naphthyl groups including one, two, three or more $C_1$ to $C_6$-alkyl groups.

Suitable heteroaryl groups are preferably monocyclic- or polycyclic aromatic rings comprising carbon atoms and one or more heteroatoms in the ring structure. Preferably 1 to 4 heteroatoms independently selected from nitrogen, oxygen, selenium and sulphur and/or combinations thereof. Examples include pyridyl, pyrimidyl, pyrazoyl, triazinyl, imidazolyl, (1,2,3,)- and (1,2,4)-triazolyl, tetrazolyl, furyl, thienyl, isoxazolyl, thiazolyl and carbazoyl.

More preferably R¹ and R² are independently represented by hydrogen or an optionally substituted alkyl, aryl or aralkyl group, and/or combination thereof.

Most preferably, R¹ and R² independently represent hydrogen or methyl.

The alkyl, cycloalkyl, aralkyl, aryl or heteroaryl groups may include one or more substituents. The optional substituents on the alkyl, cycloalkyl, aralkyl, aryl or heteroaryl groups are preferably selected from an alkyl group such as a methyl, ethyl, n-propyl, isopropyl, n-butyl, 1-isobutyl, 2-isobutyl and tertiary-butyl group; an ester, amide, ether, thioether, ketone, aldehyde, sulfoxide, sulfone, sulfonate ester or sulphonamide group, a halogen such as fluorine, chlorine, bromine or iodine, —OH, —SH, —CN and —NO₂, and/or combinations thereof.

The linking groups L² and L³ preferably independently represent a group as described above for L¹.

Preferably, the linking group L¹ of Formula (I) and Formula (II) does not contain a tertiary amine group because these groups are often responsible for staining on the plate in the non-image areas after processing. Compounds including a linking group L¹ containing an aromatic ring structure may be of less interest because they have a limited solubility in the photopolymer coating solution.

In a preferred embodiment, n=0 and the inventive compound is represented by Formula (III):

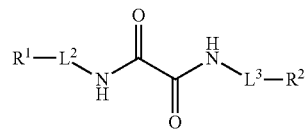

wherein R¹ and R² independently represent a terminal group as described above;
and L² and L³ independently represent a divalent linking group as described above.

In a most preferred embodiment the compounds according to the present invention are presented by Formula (IV):

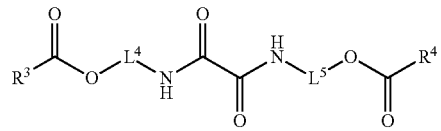

wherein R³ and R⁴ independently represent a terminal group; and L⁴ and L⁵ independently represent an optionally substituted divalent linking group.

The optionally substituted divalent linking groups L⁴ and L⁵ preferably independently represent a group as described above for the divalent linking groups L¹ and L².

Preferably, the terminal groups R³ and R⁴ independently represent a group as described above for the terminal groups R¹ and R².

The alkylene group as referred to in the above paragraphs is preferably an aliphatic group including straight or branched carbon chain(s) and is preferably represented by —(CH₂)$_p$— wherein p represent 0, 1, or an integer greater than 1, preferably an integer selected from to 1 to 20, more preferably p represent an integer selected from 1 to 10, most preferably p represent an integer selected from 2, 3, 4, 5 or 6.

The amount of the inventive compound in the coating ranges between more than 10% wt and below 40% wt relative to the total dry weight of the ingredients of the coating. Preferably, the inventive compound is present in the coating in an amount—relative to the total dry weight of the ingredients of the coating—ranging between 12% wt and 35% wt, more preferably in an amount ranging between 15% wt and 30% wt and most preferably 15% wt and 25% wt.

Suitable Examples of inventive compounds are given below in Table A.

TABLE A

Suitable Examples of compounds according to the present invention.

| Compound | inventive compound |
|---|---|
| COMP-1 | HOCH₂CH₂CH₂-NH-C(=O)-C(=O)-NH-CH₂CH₂CH₂OH |
| COMP-2 | CH₃C(=O)O-CH₂CH₂CH₂-NH-C(=O)-C(=O)-NH-CH₂CH₂CH₂-OC(=O)CH₃ |
| COMP-3 | (2-ethylhexyl)-NH-C(=O)-C(=O)-NH-(2-ethylhexyl) |
| COMP-4 | Cl-CH₂CH₂-C(=O)O-CH₂CH₂CH₂-NH-C(=O)-C(=O)-NH-CH₂CH₂CH₂-OC(=O)-CH₂CH₂-Cl |
| COMP-5 | HO-CH₂CH₂-NH-C(=O)-C(=O)-NH-CH₂CH₂-OH |
| COMP-6 | HO-(CH₂)₅-NH-C(=O)-C(=O)-NH-(CH₂)₅-OH |
| COMP-7 | HO-CH(CH₃)CH₂-NH-C(=O)-C(=O)-NH-CH₂CH(CH₃)-OH |
| COMP-8 | HO-CH₂CH₂CH₂-NH-C(=O)-(CH₂)₄-C(=O)-NH-CH₂CH₂CH₂-OH |
| COMP-9 | iBu-NH-C(=O)-C(=O)-NH-iBu |
| COMP-10 | sBu-NH-C(=O)-C(=O)-NH-sBu |

TABLE A-continued
Suitable Examples of compounds according to the present invention.
| Compound | inventive compound |
|---|---|
| COMP-11 | 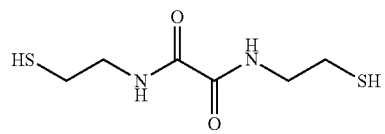 [SMILES: O=C(NCCS)C(=O)NCCS] |
| COMP-12 | 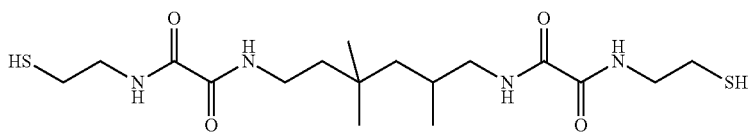 [SMILES: CC(CNC(=O)C(=O)NCCS)CC(C)(C)CCNC(=O)C(=O)NCCS] |
| COMP-13 | 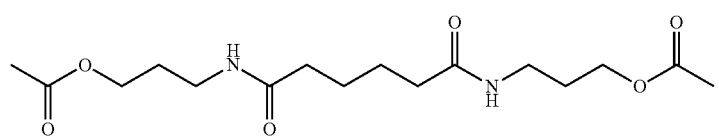 [SMILES: CC(=O)OCCCNC(=O)CCCCC(=O)NCCCOC(C)=O] |
| COMP-14 | 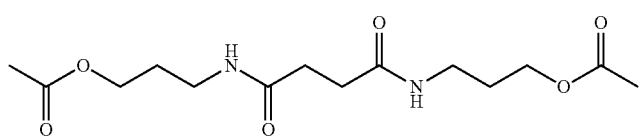 [SMILES: CC(=O)OCCCNC(=O)CCC(=O)NCCCOC(C)=O] |
| COMP-15 | 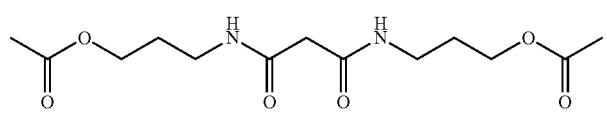 [SMILES: CC(=O)OCCCNC(=O)CC(=O)NCCCOC(C)=O] |
| COMP-16 | 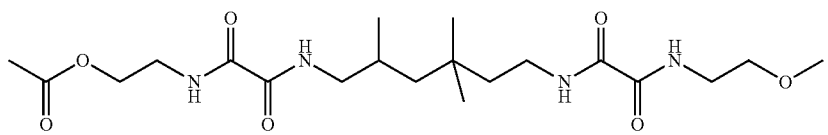 [SMILES: COCCNC(=O)C(=O)NCCC(C)(C)CC(C)CNC(=O)C(=O)NCCOC(C)=O] |
| COMP-17 | 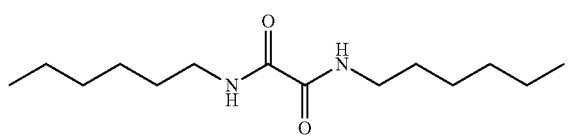 [SMILES: CCCCCCNC(=O)C(=O)NCCCCCC] |
| COMP-18 | 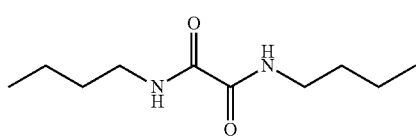 |
| COMP-19 | 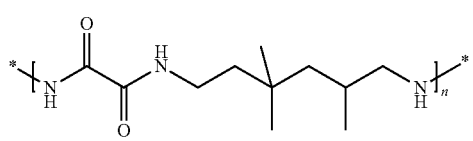<br>with n = 1-100 |
| COMP-20 | 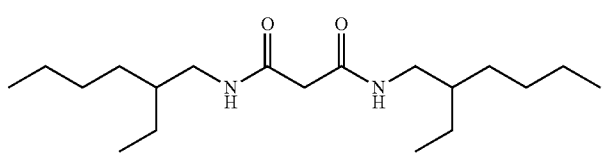 [SMILES: CCCCC(CC)CNC(=O)CC(=O)NCC(CC)CCCC] |

TABLE A-continued

Suitable Examples of compounds according to the present invention.

| Compound | inventive compound |
|---|---|
| COMP-21 | (structure: cyclohexyl-NH-C(O)-CH₂-CH₂-C(O)-NH-cyclohexyl) |
| COMP-22 | (structure: HS-substituted methyl-triazole-CH₂-NH-C(O)-C(O)-NH-CH₂-methyl-triazole-SH) |
| COMP-23 | (structure: cyclohexyl-NH-C(O)-C(O)-NH-cyclohexyl) |

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optionally heating step, hereinafter also referred to as "pre-heat", the plate precursor is heated, preferably at a temperature of about 80° C. to 150° C. and preferably during a dwell time of about 5 seconds to 1 minute.

The coating has at least one layer including a photopolymerisable composition, said layer is also referred to as the "photopolymerisable layer". The coating may include an intermediate layer, located between the support and the photopolymerisable layer. Preferably, the coating comprises one layer—i.e. the photopolymerisable layer—which is the outermost layer. The compound according to the present invention may be present in the photopolymerisable layer or in an optional other layer. Preferably, the compound according to the present invention is present in the photopolymerisable layer.

The photopolymerisable layer includes, besides the compound according to the present invention, a polymerisable compound, optionally a binder, a polymerization initiator capable of hardening the polymerisable compound in the exposed areas, and optionally a sensitizer capable of absorbing light used in the image-wise exposing step. The photopolymerisable layer has a coating thickness preferably ranging between 0.4 and 5.0 g/m², more preferably between 0.5 and 3.0 g/m², most preferably between 0.6 and 2.2 g/m².

According to a preferred embodiment, the polymerisable compound is a monomer or oligomer including at least one epoxy or vinyl ether functional group and the polymerisation initiator is a Brönsted acid generator capable of generating free acid, optionally in the presence of a sensitizer, upon exposure, hereinafter the Brönsted acid generator is also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A-epichlorohydrin epoxy resin and multifunctional epichlorohydrintetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Brönsted acid, they also generate free radicals during photo or thermal decomposition.

According to a more preferred embodiment of the present invention, the polymerisable compound is a polymerisable monomer or oligomer including at least one terminal ethylenic group, hereinafter also referred to as "free-radical polymerisable monomer", and the polymerisation initiator is a compound capable of generating free radicals upon exposure, optionally in the presence of a sensitizer, hereinafter said initiator is referred to as "free radical initiator". The polymerisation involves the linking together of the free-radical polymerisable monomers.

Suitable free-radical polymerisable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Any free radical initiator capable of generating free radicals upon exposure directly or in the presence of a sensitizer, is according to this invention a suitable initiator. Suitable free-radical initiators are described in WO 2005/111727 from page 15 line 17 to page 16 line 11.

In a preferred embodiment of the present invention the photopolymerisable composition comprises a hexaaryl-bisimidazole compound (HABI; dimer of triaryl-imidazole) as polymerisation initiator, optionally in combination with further polymerisation initiators.

A procedure for the preparation of hexaarylbisimidazoles is described in DE 1470 154 and their use in photopolymerisable compositions is documented in EP 24 629, EP 107 792, U.S. Pat. No. 4,410,621; EP 215 453 and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-chlorophenyl)-4,5,4',5'-tetrakis(3-methoxyphenyl)bisimidazole and 2,2'-bis(2-nitrophenyl)-4,5,4',5'-tetraphenylbisimidazole. The amount of the HABI polymerization initiator typically ranges from 0.01 to 30% by weight, preferably from 0.5 to 20% by weight, relative to the total weight of the non volatile components of the photopolymerisable composition.

A very high sensitivity can be obtained in the context of the present invention by the combination of an optical brightener as sensitizer and a hexaarylbisimidazole compound as polymerisation initiator.

Suitable classes of polymerisation initiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition comprises a non-boron comprising polymerisation initiator and particularly preferred the polymerisation initiator comprises no boron compound. Many specific examples of initiators suitable for the present invention can be found in EP-A 1 091 247. Other preferred polymerization initiators are trihalo methyl sulphones.

Preferably hexaarylbisimidazole compounds and/or metallocene compounds are used alone or in combination with other suitable photoinitiators, in particular with aromatic ketones, aromatic onium salts, organic peroxides, thio compounds, ketoxime ester compounds, azinium compounds, active ester compounds or compounds having a carbon halogen bond.

In a preferred embodiment of the present invention the hexaarylbisimidazole compounds make more than 50 mol %, preferably at least 80 mol % and particularly preferred at least 90 mol % of all the photoinitiators used in the photopolymerisable composition of the present invention.

According to another embodiment of the present invention, the polymerisable monomer or oligomer may be a combination of a monomer or oligomer comprising at least one epoxy or vinyl ether functional group and a polymerisable ethylenically unsaturated compound having at least one terminal ethylenic group, and the polymerisation initiator may be a combination of a cationic initiator and a free-radical initiator. A monomer or oligomer comprising at least one epoxy or vinyl ether functional group and a polymerisable ethylenically unsaturated compound having at least one terminal ethylenic group, can be the same compound wherein the compound contains both the ethylenic group and the epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate, triarylsulfonium hexafluoroantimonate, and s-triazines such as 2,4-bis(trichloromethyl)-6-[(4-ethoxyethylenoxy)-phen-1-yl]-s-triazine which are capable of generating both free radical and free acid, preferably in the presence of a sensitizer.

The photopolymerisable layer may also comprise a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049,479, EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 2—Prepolymers and Reactive Diluents for UV and EB Curable Formulations by N. S. Allen, M. A. Johnson, P. K. T. Oldring, M. S. Salim—Edited by P. K. T. Oldring—1991—ISBN 0 947798102. Particularly preferred are urethane (meth)acrylate multifunctional monomers, which can be used alone or in combination with other (meth)acrylate multifunctional monomers.

The photopolymerisable layer may also comprise a co-initiator. Typically, a co-initiator is used in combination with a free radical initiator and/or a cationic initiator. Suitable co-initiators for use in the photopolymer coating are disclosed in U.S. Pat. No. 6,410,205; U.S. Pat. No. 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole, 2-mercapto-benzimidazole, 4-methyl-3-propyl-1,2,4-triazoline-5-thione, 4-methyl-3-n-heptyl-1,2,4-triazoline-5-thione, 4-phenyl-3-n-heptyl-1,2,4-triazoline-5-thione, 4-phenyl-3,5-dimercapto-1,2,4-triazole, 4-n-decyl-3,5-dimercapto-1,2,4-triazole, 5-phenyl-2-mercapto-1,3,4-oxadiazole, 5-methylthio-1,3,4-thiadiazoline-2-thione, 5-hexylthio-1,3,4-thiadiazoline-2-thione, mercaptophenyltetrazole, pentaerythritol mercaptopropionate, butyric acid-3-mercapto-neopentanetetrayl ester, pentaerythritol tetra(thioglycolate).

Other preferred co-initiators are polythioles as disclosed in WO 2006/048443 and WO 2006/048445. These polythiols may be used in combination with the above described thiols, e.g. 2-mercaptobenzthiazole.

The photopolymerisable layer may also comprise particles which increase the resistance of the coating against manual or mechanical damage. The particles may be inorganic particles, such as for example silica, alumina, iron oxides, magnesium carbonate, titanium oxide and calcium carbonate. The particles may be organic particles or fillers, such as for example polymer particles, waxes, carbon black and silicone resins. The particles preferably have a particle size of about 0.01 to 2 μm. More information on suitable particles is described in for example U.S. Pat. No. 7,108, 956.

The photopolymerisable layer may also comprise organic or inorganic spacer particles which increase the resistance of the coating against manual or mechanical damage. The spacer particles have preferably a particle size larger than 0.5 μm, more preferably a particle size larger than 0.8 μm, most preferably equal to or larger than 1.0 μm. The particle size is preferably comprised between 0.5 μm and 15 μm, more preferably between 0.5 μm and 7 μm, most preferably between 1 μm and 5 μm. The particle size refers to the average particle size and may be measured by a laser diffraction particle analyzer such as the Coulter LS Particle Size Analyzer, e.g. the Coulter LS-230, commercially available by Beckman Coulter Inc. The average particle size is defined as the mean or median of the volume distribution of particle size.

For obtaining a significant effect of improving the resistance of the coating against manual or mechanical damage, the spacer particles should extend the surface of the coating. The coating has preferably a layer thickness greater than 0.5 g/m², more preferably the layer thickness is comprised between 0.6 g/m² and 2.8 g/m². The particle size of the spacer particles is preferably comprised between one to two times the thickness of the coating.

Examples of inorganic spacer particles include silicium, titanium, aluminium, zinc, iron, chromium or zirconium containing particles, metal oxides or hydroxides thereof, aluminiumsilicates, and metal salts such as calcium carbonate, barium sulfate, barium titanate and strontium titanate.

Examples of organic spacer particles include optionally cross-linked polyalkyl(meth)acrylate such as polymethylmethacrylate, polystyrene, melamine, polyolefins such as polyethylene or polypropylene, halogenated polyolefins such as fluorinated polyolefins for example polytetrafluoroethylene, silicones such as cross-linked polysiloxane particles, or copolymers thereof. Examples of polysiloxane particles include cross-linked polyalkylsiloxanes such as polymethylsiloxane. Commercially available cross-linked polysiloxane particles are for example Tospearl from TOSHIBA SILICONE Co., Ltd.

The photopolymerizable layer may also comprise an inhibitor. Particular inhibitors for use in the photopolymer coating are disclosed in U.S. Pat. No. 6,410,205, EP 1 288 720 and EP 1 749 240. The photopolymerizable layer may further comprise an adhesion promoting compound. More information on suitable adhesion promoting compounds are described in EP 1 788 434 in [0010] and in the non-published patent application PCT/EP2013/055773.

Besides the compound according to the invention, the photopolymerizable layer may include a binder. The binder can be selected from a wide series of organic polymers. Compositions of different binders can also be used. Useful binders are described in WO2005/052298 page 17 line 21 to page 19 line 30, in EP 152 819 on page 2 line 50 to page 4 line 20, and in EP 1 043 627 in paragraph [0013].

The organic polymers used as binders have a typical mean molecular weight $M_w$ between 1000 and 700 000, preferably between 1500 and 350 000. Preferably, the binders have a hydroxyl number between 0 and 750, more preferably between 10 and 500. Even more preferably the hydroxyl number is below 10, most preferably the hydroxyl number is 0. The amount of binder(s) generally ranges from 1 to 60% by weight, preferably 5 to 50% by weight, more preferably 10 to 35% by weight and most preferably 15 to 25% by weight relative to the total weight of the non-volatile components of the composition.

In another embodiment the polymeric binder comprises a backbone including pendant groups such as for example a hydrophilic poly(alkylene oxide) segment. The polymeric binder may also include pendant cyano groups attached to the backbone. A combination of such binders may also be employed. Generally the polymeric binder is solid at room temperature, and is typically a non-elastomeric thermoplastic. Generally the polymeric binder is characterized by a number average molecular weight (Mn) in the range from about 500 to 250000, more commonly in the range from about 1000 to 240000 or 1500 to 200000. The polymerisable composition may comprise discrete particles of the polymeric binder. Preferably the discrete particles are particles of the polymeric binder which are suspended in the polymerisable composition. The presence of discrete particles tends to promote developability of the unexposed areas. Specific examples of the polymeric binders according to this embodiment are described in U.S. Pat. No. 6,899,994; US 2004/0260050, US 2005/0003285, US 2005/0170286 and US 2005/0123853. In addition to the polymeric binder of this embodiment the imageable layer may optionally comprise one or more co-binders. Typical co-binders are water-soluble or water-dispersible polymers, such as, cellulose derivatives, polyvinylalcohol, polyacrylic acid poly(meth) acrylic acid, polyvinylpyrrolidone, polylactide, polyvinylphosphonic acid, synthetic co-polymers, such as the co-polymer of an alkoxy polyethylene glycol (meth)acrylate. Specific examples of co-binders are described in US 2004/0260050, US 2005/0003285 and US 2005/0123853. Printing plate precursors, the imageable layer of which comprises a binder and optionally a co-binder according this embodiment and described in more detail in US 2004/0260050, US 2005/0003285 and US 2005/0123853, optionally comprising a topcoat and an interlayer.

Various surfactants may be added into the photopolymerisable layer to allow or enhance the developability of the precursor; especially developing with a gum solution. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20% by weight of the coating, and most preferably between 1 and 15% by weight of the coating or between 2 and 8% by weight of the coating.

Suitable examples of optical brighteners as sensitizers are described in WO 2005/109103 page 24, line 20 to page 39. The photocurable composition may also comprise other sensitizers. Highly preferred sensitizers are violet light absorbing sensitizers, having an absorption spectrum between 350 nm and 450 nm, preferably between 370 nm and 420 nm, more preferably between 390 nm and 415 nm. Particular preferred sensitizers are disclosed in EP 1 349 006 paragraph [0007] to [0009], EP 1 668 417 and WO 2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particular preferred sensitizers are heptamethinecyane dyes, especially the dyes disclosed in EP 1 359 008 paragraph [0030] to [0032]. Other preferred sensitizers are blue, green or red light absorbing sensitizers, having an absorption spectrum between 450 nm and 750 nm. Useful sensitizers can be selected from the sensitizing dyes disclosed in U.S. Pat. No. 6,410,205; U.S. Pat. No. 5,049,479; EP 1 079 276, EP 1 369 232, EP 1 369 231, EP 1 341 040, US 2003/0124460, EP 1 241 002 and EP 1 288 720.

The photopolymerisable layer or an optional other layer of the coating may also comprise a colorant. After processing, at least part of the colorant remains on the hardened coating areas, and a visible image can be produced on the support by removing the coating, including the colorant, at the non-exposed areas. The colorant can be a dye or a pigment. Various types of pigments can be used such as organic pigments, inorganic pigments, carbon black, metallic powder pigments and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples and more detailed information of pigments suitable as colorant in the current invention are described in EP 2 278 404 in paragraphs [0064] to [0068].

Typically, the amount of pigment in the coating may be in the range of about 0.005 g/m$^2$ to 2 g/m$^2$, preferably about 0.007 g/m$^2$ to 0.5 g/m$^2$, more preferably about 0.01 g/m$^2$ to 0.2 g/m$^2$, most preferably about 0.01 g/m$^2$ to 0.1 g/m$^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as colorant in the photopolymerisable coating. Specific examples thereof are described in EP 2 278 404 in paragraph [0070].

Typically, the amount of dye in the coating may be in the range of about 0.005 g/m$^2$ to 2 g/m$^2$, preferably about 0.007 g/m$^2$ to 0.5 g/m$^2$, more preferably about 0.01 g/m$^2$ to 0.2 g/m$^2$, most preferably about 0.01 g/m$^2$ to 0.1 g/m$^2$.

The photopolymerisable layer or an optional other layer of the coating may include a printing-out agent, i.e. a compound which is capable of changing the color of the coating upon exposure. After image-wise exposing of the precursor, a visible image can be produced, hereinafter also referred to as "print-out image". The printing-out agent may be a compound as described in EP-A-1 491 356 paragraph [0116] to [0119] on page 19 and 20, and in US 2005/8971 paragraph [0168] to [0172] on page 17. Preferred printing-out agents are the compounds described in EP 1 765 592 from line 1 page 9 to line 27 page 20. More preferred are the IR-dyes as described in EP 1 736 312 from line 32 page 5 to line 9 page 32. The contrast of the image formed after image-wise exposure and processing is defined as the difference between the optical density at the exposed area and the optical density at the non-exposed area, and this contrast is preferably as high as possible. This enables the end-user to establish immediately whether or not the precursor has already been exposed and processed, to distinguish the different color selections and to inspect the quality of the image on the plate precursor. The contrast increases with increasing optical density in the exposed area and/or decreasing optical density in the non-exposed areas. The optical density in the exposed area may increase with the amount and extinction coefficient of the colorant remaining in the exposed areas and the intensity of color formed by the printing-out agent. In the non-exposed areas it is preferred that the amount of colorant is as low as possible and that the intensity of color print-out agent is as low as possible. The optical density can be measured in reflectance using an optical densitometer, equipped with several filters (e.g. cyan, magenta, yellow). The difference in optical density in the exposed area and the non-exposed area has preferably a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e. under blue color we understand a color that appears blue for the human eye.

The coating may include on the photopolymerisable layer, a toplayer or protective overcoat layer which acts as an oxygen barrier layer including water-soluble or water-swellable binders; however, the coating preferably does not contain a toplayer or protective overcoat layer. Printing plate precursors which do not contain a toplayer or protective overcoat layer are also referred to as overcoat-free printing plate precursors. Preferred binders which can be used in the toplayer are polyvinyl alcohol and the polymers disclosed in WO 2005/029190, U.S. Pat. No. 6,410,205 and EP 1 288 720, including the cited references in these patents and patent applications. The most preferred binder for the toplayer is polyvinylalcohol. The polyvinylalcohol has preferably a hydrolysis degree ranging between 74 mol % and 99 mol %, more preferably between 88-98%. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

The coating thickness of the optional toplayer is preferably between 0.25 and 1.75 g/m$^2$, more preferably between 0.25 and 1.3 g/m$^2$, most preferably between 0.25 and 1.0 g/m$^2$. In a more preferred embodiment of the present invention, the optional toplayer has a coating thickness between 0.25 and 1.75 g/m$^2$ and comprises a polyvinylalcohol having a hydrolysis degree ranging between 74 mol % and 99 mol % and a viscosity number as defined above ranging between 3 and 26.

The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate of the current invention has preferably an Ra value below 0.45 µm, more preferably below 0.40 µm and most preferably below 0.30 µm. The lower limit of the Ra value is preferably about 0.1 µm. More details concerning the preferred Ra values of the surface of the grained and anodized aluminum support are described in EP 1 356 926. By anodising the aluminum support, an $Al_2O_3$ layer is formed and the anodic weight (g/m$^2$ $Al_2O_3$ formed on the aluminum surface) varies between 1 and 8 g/m². The anodic weight is preferably ≥3 g/m², more preferably ≥3.5 g/m² and most preferably ≥4.0 g/m²

The grained and anodized aluminium support may be subjected to so-called post-anodic treatments, for example a treatment with polyvinylphosphonic acid or derivatives thereof, a treatment with polyacrylic acid, a treatment with potassium fluorozirconate or a phosphate, a treatment with an alkali metal silicate, or combinations thereof. Alternatively, the support may be treated with an adhesion promoting compound such as those described in EP 1 788 434 in [0010] and in the non-published patent application PCT/EP2013/055773. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

The lithographic printing plate precursor of the present invention can be prepared by (i) applying on a support as described above the coating as described above and (ii) drying the precursor.

According to the present invention there is also provided a method for making a negative-working lithographic printing plate comprising the steps of imagewise exposing the printing plate precursor followed by developing the imagewise exposed precursor so that the non exposed areas are dissolved in the developer solution. Optionally, after the imaging step, a heating step is carried out to enhance or to speed-up the polymerization and/or crosslinking reaction.

The image-wise exposing step can be carried out by a laser. Preferably, the image-wise exposing step is carried out off-press in a platesetter, i.e. an exposure apparatus suitable for image-wise exposing the precursor by a laser such as a laser diode, emitting around 830 nm, a Nd YAG laser, emitting around 1060 nm, a violet laser, emitting around 400 nm, or a gas laser such as an Ar laser, or with a digitally modulated UV-exposure set-up, using e.g. digital mirror devices, or by a conventional exposure in contact with a mask. In a preferred embodiment of the present invention, the precursor is image-wise exposed by a laser emitting IR-light or violet light.

During the optional heating step the plate precursor is heated, preferably at a temperature of about 80° C. to 150° C. and preferably during a dwell time of about 5 seconds to 1 minute. The preheating step is preferably carried out in a preheating unit which is preferably provided with heating elements such as IR-lamps, UV-lamps, heated air, a heated metal roll, etc.

After the exposing step or, when a preheating step is present, after the preheating step, the precursor may be washed in a prewashing station, whereby at least part of the toplayer, if present, can be removed by supplying a wash liquid, i.e. water or an aqueous solution, to the coating of the precursor. The washing liquid is preferably water, more preferably tap water. More details concerning the wash step are described in EP 1 788 434 in [0026].

After the exposure step, the optional heating step and the optional prewashing step, the precursor is preferably developed by means of immersing the precursor in a developing solution. The developing step is preferably carried out off-press with an aqueous alkaline developing solution or a gum solution. During the development step, the non-exposed areas of the image-recording layer are at least partially removed without essentially removing the exposed areas. The processing liquid can be applied to the plate e.g. by rubbing with an impregnated pad, by dipping, immersing, (spin-)coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or preservative as known in the art. During the development step, any water-soluble protective layer present is preferably also removed. The development is preferably carried out at temperatures between 20 and 40° C. in automated processing units as customary in the art. More details concerning the development step can be found in for example EP 1 614 539 in [42] to [43]. Development in a gumming station comprising at least one gumming unit is for example described in WO 2007/057348 on page 40 line 34 to page 44 line 14.

The development step with an aqueous alkaline developing solution may be followed by a rinsing step and/or a gumming step.

Alternatively, the development step can be carried out by applying a gum solution thereby removing the non-exposed areas of the photopolymerisable layer from the support and gumming the plate in a single step. Preferably, the gumming unit is mechanically coupled to the platesetter by conveying means wherein the precursor is shielded from ambient light. A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 g/m² of the surface protective compound, more preferably between 0.010 and 10 g/m², most preferably between 0.020 and 5 g/m². More details concerning the surface protective compounds in the gum solution can be found in WO 2007/057348 page 9 line 3 to page 11 line 6.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022]. The viscosity of the gum solution can be adjusted to a value of e.g. between 1.7 and 5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Alternatively, the development step can be carried out on press by mounting the exposed precursor on a plate cylinder of a lithographic printing press and rotating the plate cylinder while feeding dampening liquid and/or ink to the coating.

After the processing step the plate may be dried in a drying unit. In a preferred embodiment the plate is dried by heating the plate in the drying unit which may contain at least one heating element selected from an IR-lamp, an UV-lamp, a heated metal roller or heated air. In a preferred embodiment of the present invention, the plate is dried with heated air as known in the drying section of a classical developing machine.

After drying the plate, the plate can optionally be heated in a baking unit. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

Synthesis of the Inventive Compounds

Synthesis of Inventive Compound COMP-1

Reaction scheme:

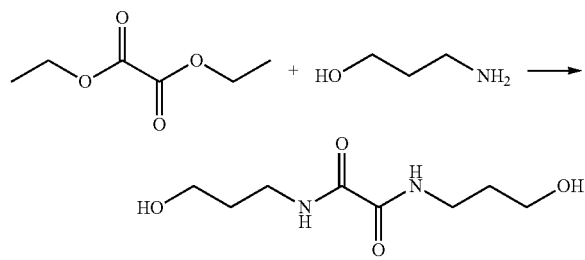

Experimental Procedure:

1 g diethyl oxalate (99% from ACROS) was dissolved in 5 ml ethanol. 1.03 g 3-amino-1-propanol (99% from ACROS) was added dropwise to the solution. The mixture was stirred for 1 hour at room temperature. The product (white precipitate) was filtrated, washed with ethanol and dried. The compound was analyzed using TLC-chromatography (TLC Silica gel 60 F254; supplied by Merck, eluent: methylene chloride/methanol 90/10, $R_f$: 0.15).

Synthesis of Inventive Compound COMP-2

Reaction scheme:

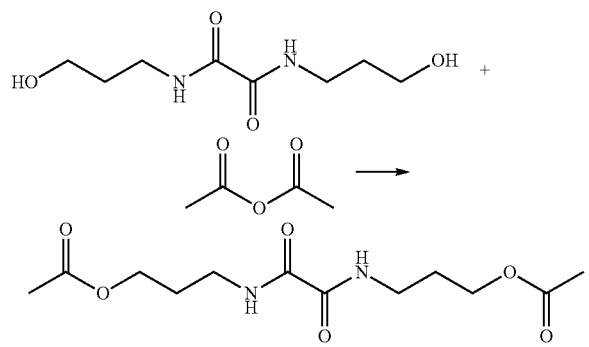

Experimental Procedure:

4 g N,N'-Bis(3-hydroxypropyl)oxamide was added to 25 ml of acetonitrile. 18.4 ml acetic anhydride was added to the mixture. The reaction was allowed to continue over night under reflux. The reaction mixture was evaporated under reduced pressure. The product was washed with methyl tert-butyl ether and dried. The compound was analyzed using TLC-chromatography (TLC RP-18 F254; supplied by Merck, eluent: methanol/0.5M aqeous NaCl solution 80/20, Rf: 0.85).

Synthesis of Inventive Compound COMP-3

Reaction scheme:

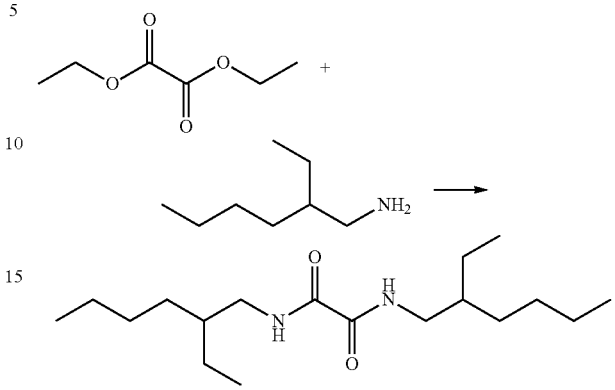

Experimental Procedure:

5.1 g diethyl oxalate (99% from ACROS) was dissolved in 10 ml dichloromethane. 11.6 ml 2-ethylhexyl amine was added dropwise to the solution. The mixture was stirred 4 hours at room temperature. The product (white precipitate) was filtrated, washed with n-hexane and dried. The crude product (white crystals) was used without further purification. The compound was analyzed using TLC-chromatography (TLC Silica gel 60 Partisil KC18F; supplied by Whatman, eluent: methanol/0.5M aqeous NaCl solution 90/10, Rf: 0.35).

Synthesis of Inventive Compound COMP-4

Reaction scheme:

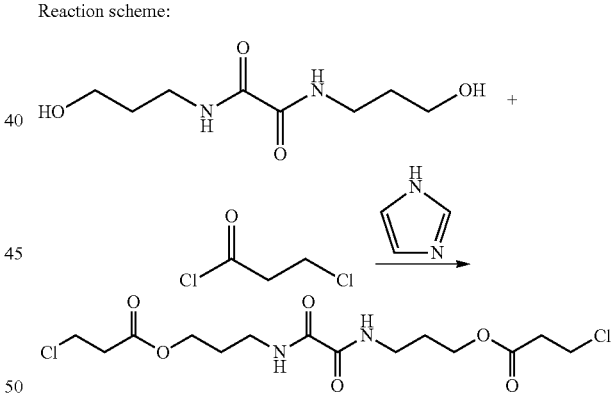

Experimental Procedure:

10 g imidazole were dissolved in 130 ml methylene chloride and the solution was cooled down to −10° C. 15.3 g 3-chloropropanoyl chloride was added dropwise to the reaction mixture while the temperature was kept below 0° C. After 30 minutes, the reaction mixture was brought to room temperature and 6.82 g N,N'-Bis(3-hydroxypropyl)oxamide was added to the reaction mixture. The reaction was allowed to continue for 3 hours under reflux. The reaction mixture was filtered in order to remove salts and the filtrate was evaporated under reduced pressure. The crude product washed with water. The compound was analyzed using TLC-chromatography (TLC Silica gel 60 F254; supplied by Merck, eluent: methylene chloride/methanol 90/10, Rf: 0.85).

Synthesis of Inventive Compound COMP-5

Reaction scheme:

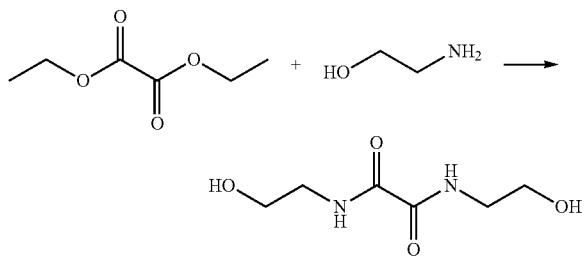

Experimental Procedure:
10 g diethyl oxalate (99% from ACROS) was dissolved in 50 ml ethanol. 6.21 g 2-amino-1-ethanol (99% from Acros) was added dropwise to the solution. The mixture was stirred over night at room temperature. The product (white precipitate) was filtrated, washed with ethanol and dried. The compound was analyzed using TLC-chromatography (TLC Silica gel 60 F254; supplied by Merck, eluent: methylene chloride/methanol 90/10, Rf: 0.20).

Synthesis of Inventive Compound COMP-6

Reaction scheme:

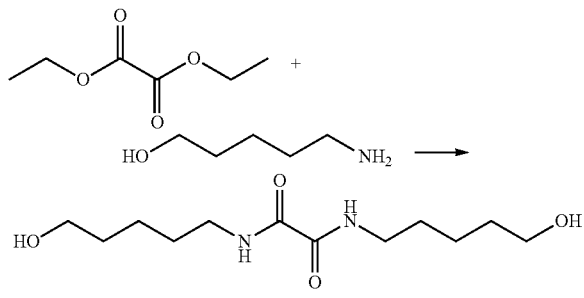

Experimental Procedure:
5 g diethyl oxalate (99% from ACROS) was dissolved in 50 ml acetone. 7.42 g 5-amino-1-pentanol was added dropwise to the solution. The mixture was stirred for 1 hour at room temperature. The product (white precipitate) was filtrated, washed with acetone and dichloromethane and dried. The compound was analyzed using TLC-chromatography (TLC Silica gel 60 F254; supplied by Merck, eluent: methylene chloride/methanol 90/10, Rf: 0.30).

Synthesis of Inventive Compound COMP-7

Reaction scheme:

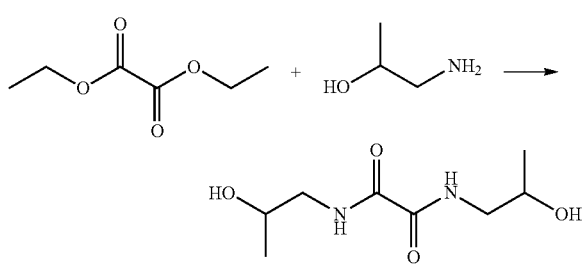

Experimental Procedure:
10 g diethyl oxalate (99% from ACROS) was dissolved in 50 ml ethanol. 6.21 g 1-amino-2-propanol was added dropwise to the solution. The mixture was stirred over night at room temperature. The product (white precipitate) was filtrated, washed with ethanol and dried. The compound was analyzed using TLC-chromatography (TLC Silica gel 60 F254; supplied by Merck, eluent: methylene chloride/methanol 90/10, Rf: 0.15).

Synthesis of Inventive Compound COMP-8

Reaction scheme:

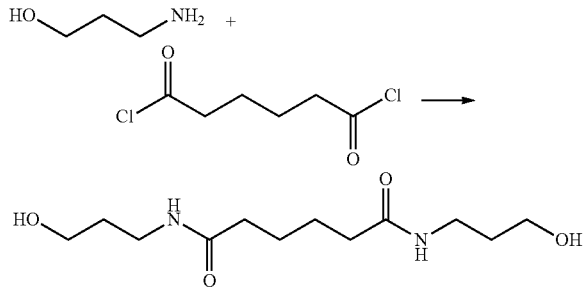

Experimental Procedure:
1 g adipyl chloride was added dropwise at 0° C. to 5 g 3-amino-1-propanol. The reaction was allowed to continue over night at room temperature under mild stirring. 20 ml methoxypropanyl and 20 ml ethyl acetate were added to the reaction mixture. The product (white crystals) was filtrated, washed with ethyl acetate and dried under reduced pressure.

Synthesis of Inventive Compound COMP-9

Reaction scheme:

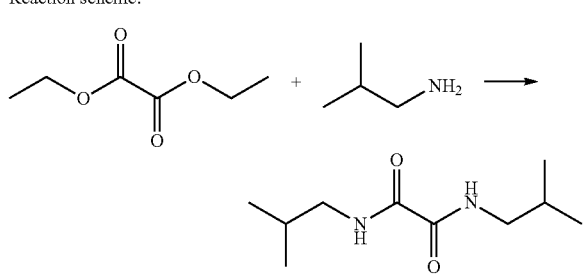

Experimental Procedure:
8.77 g diethyl oxalate (99% from ACROS) was dissolved in 15 ml dichloromethane. 12 ml isobutyl amine was added dropwise to the solution. The mixture was stirred 4 hours at room temperature. The product (white precipitate) was filtrated, washed with n-hexane and dried. The crude product (white crystals) was used without further purification. The compound was analyzed using TLC-chromatography (TLC Silica gel 60 Partisil KC18F; supplied by Whatman, eluent: methanol/0.5M aqeous NaCl solution 90/10, Rf: 0.65).

Synthesis of Inventive Compound COMP-10

Reaction scheme:

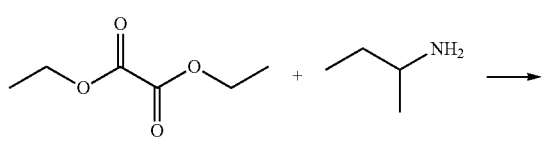

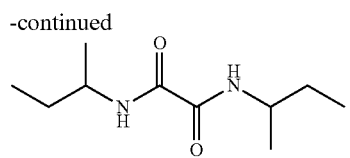

Experimental Procedure:

8.77 g diethyl oxalate (99% from ACROS) was dissolved in 15 ml dichloromethane. 12.2 ml sec-butyl amine was added dropwise to the solution. The mixture was stirred 4 hours at room temperature. The product (white precipitate) was filtrated, washed with n-hexane and dried. The crude product (white crystals) was used without further purification. The compound was analyzed using TLC-chromatography (TLC Silica gel 60 Partisil KC18F; supplied by Whatman, eluent: methanol/0.5M aqeous NaCl solution 90/10, Rf: 0.65).

Polymerisable Compounds.

TABLE 1

Polymerisable compounds.

| Polymerisable compounds | Structure | |
|---|---|---|
| FST510* commercially available from AZ ELECTRONICS MATERIALS | | M-1 |
| EBECRYL 4858* commercially available from CYTEC INDUSTRIES BV | | M-2 |
| SR349 commercially available from SARTOMER | | M-3 |
| CD540 commercially available from SARTOMER | | M-4 |
| SR601E commercially available from SARTOMER | | M-5 |
| Synthesis see below | | M-6 |

TABLE 1-continued

Polymerisable compounds.

| Polymerisable compounds | Structure | |
|---|---|---|
| Synthesis see below | (structure) | M-7 |
| Synthesis see below | (structure) | M-8 |
| Synthesis see below | (structure) | M-9 |
| Synthesis see below | (structure) | M-10 |
| Synthesis see below | (structure) | M-11 |
| SR295 commercially available from SARTOMER | (structure) | M-12 |
| MIRAMER M600 commercially available from RAHN AG | (structure) | M-13 |

TABLE 1-continued
Polymerisable compounds.
| Polymerisable compounds | Structure | |
|---|---|---|
| SR350 commercially available from SARTOMER | 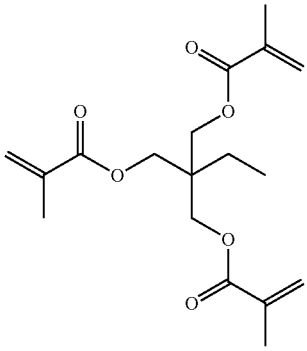 [SMILES: C=C(C)C(=O)OCC(CC)(COC(=O)C(=C)C)COC(=O)C(=C)C] | M-14 |
| SR351 commercially available from SARTOMER | 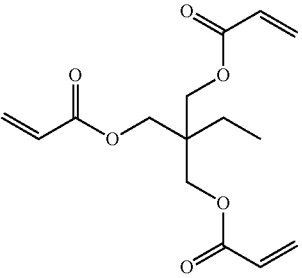 [SMILES: C=CC(=O)OCC(CC)(COC(=O)C=C)COC(=O)C=C] | M-15 |
| Tris(2-Methacryloxyethyl) Isocyanurate commercially available from DAJAC LABS | 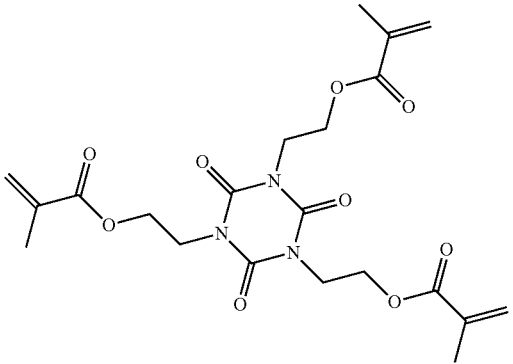 [SMILES: C=C(C)C(=O)OCCn1c(=O)n(CCOC(=O)C(=C)C)c(=O)n(CCOC(=O)C(=C)C)c1=O] | M-16 |
| SR368 c commercially available from SARTOMER | 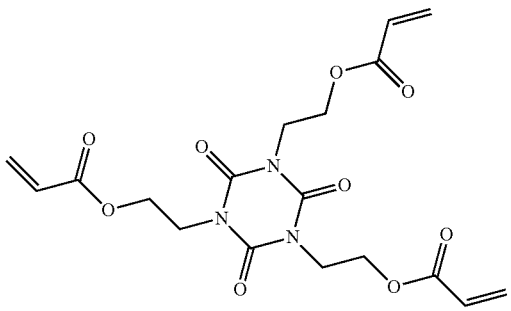 [SMILES: C=CC(=O)OCCn1c(=O)n(CCOC(=O)C=C)c(=O)n(CCOC(=O)C=C)c1=O] | M-17 |
| N—CH₃ oxalyl amide Synthesis see below | 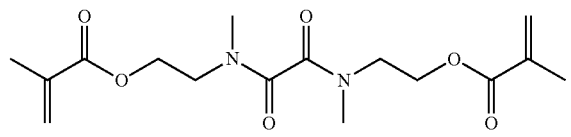 [SMILES: C=C(C)C(=O)OCCN(C)C(=O)C(=O)N(C)CCOC(=O)C(=C)C] | M-18 |
*Isomeric mixture Synthesis of Compound M-6.

Reaction scheme:

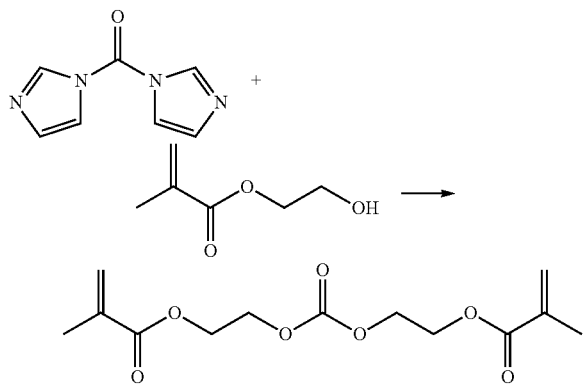

Experimental Procedure:
Experimental Procedure:
13.7 g N,N'-carbonyldiimidazole was dissolved in 50 ml dichloromethane. 0.5 ml triethylamine and 23 g hydroxyethyl methacrylate were added to the solution. The mixture was stirred over night under reflux. The major side products as well as non reacted reagents were extracted with water. The organic phase was dried with magnesium sulfate and filtrated. The organic phase was evaporated under reduced pressure. The crude product (white crystals) was used without further purification. The compound was analyzed using TLC-chromatography (TLC Silica gel 60 Partisil KC18F; supplied by Whatman, eluent: methanol/1M aqeous NaCl solution 60/40, Rf: 0.40).

Synthesis of Compound M-7.

Reaction scheme:

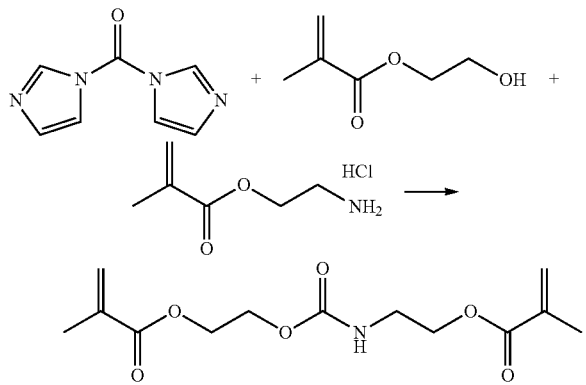

Experimental Procedure:
13.7 g N,N'-carbonyldiimidazole was dissolved in 50 ml dichloromethane. 10 g hydroxyethyl methacrylate was added to the solution. The mixture was stirred for 10 minutes at room temperature. In a separate flask, 13.2 g 2-aminoethyl methacrylate hydrochloride (90% from ALDRICH) and 11.8 ml triethylamine were dissolved in 100 ml dichloromethane. This solution was added to the reaction mixture. The reaction was stirred over night under reflux. The major side products as well as non reacted reagents were extracted with water. The organic phase was dried with magnesium sulfate and filtrated. The organic phase was evaporated under reduced pressure. The crude product (white crystals) was used without further purification. The compound was analyzed using TLC-chromatography (TLC Silica gel 60 Partisil KC18F; supplied by Whatman, eluent: methanol/1M aqeous NaCl solution 60/40, Rf: 0.40).

Synthesis of Compound M-8.

Reaction scheme:

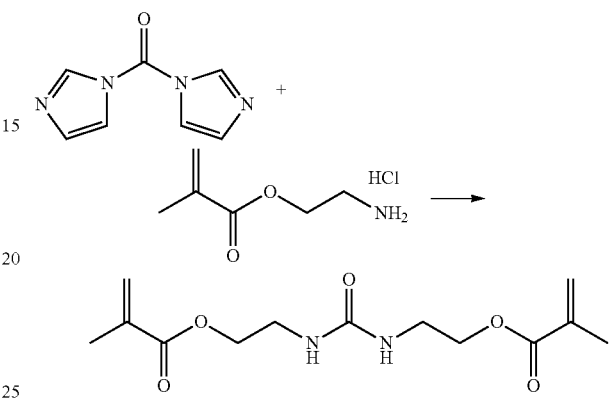

Experimental Procedure:
13.7 g N,N'-carbonyldiimidazole was dissolved in 50 ml dichloromethane. 13.5 ml triethylamine and 20 g 2-aminoethyl methacrylate hydrochloride (90% from ALDRICH) were added to the solution. The mixture was stirred over night under reflux. The major side products as well as non reacted reagents were extracted with water. The organic phase was evaporated under reduced pressure. The product was purified by column chromatography. The compound was analyzed using TLC-chromatography (TLC Silica gel 60 Partisil KC18F; supplied by Whatman, eluent: methanol/1M aqeous NaCl solution 60/40, Rf: 0.40).

Synthesis of Compound M-9.

Reaction scheme:

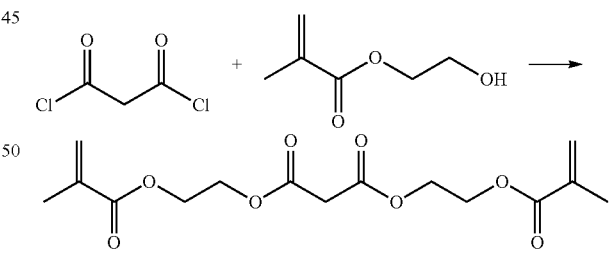

Experimental Procedure:
4 g hydroxyethyl methacrylate was added to 2.17 g malonyl chloride (97% from ALDRICH). The reaction mixture was stirred over night at room temperature. The major side products as well as non reacted reagents were extracted with an aqueous solution of sodium bicarbonate. The product was extracted with methyl tert-butyl ether and purified by column chromatography using a Prochrom LC80 column, packed with Kromasil Si 60å 10 μm and methylene chloride/ethyl acetate 30/70 as eluent. The compound was analyzed using TLC-chromatography (TLC Silica gel 60

F254; supplied by Merck, eluent: methylene chloride/methanol 90/10, Rf: 0.80).

Synthesis of Compound M-10.

Reaction scheme:

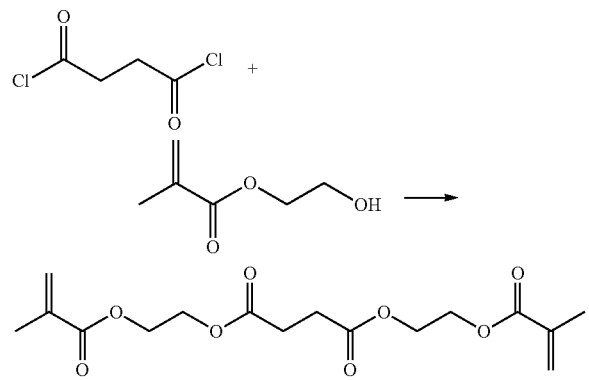

Experimental Procedure:

4 g hydroxyethyl methacrylate was added to 2.37 g succinyl chloride (95% from ALDRICH). The reaction mixture was stirred over night at room temperature. The major side products as well as non reacted reagents were extracted with an aqueous solution of sodium bicarbonate. The product was extracted with methyl tert-butyl ether and purified by column chromatography using a Prochrom LC80 column, packed with Kromasil Si 60å 10 μm and methylene chloride/ethyl acetate 30/70 as eluent. The compound was analyzed using TLC-chromatography (TLC Silica gel 60 F254; supplied by Merck, eluent: methylene chloride/methanol 90/10, Rf: 0.70).

Synthesis of Compound M-11.

Reaction scheme:

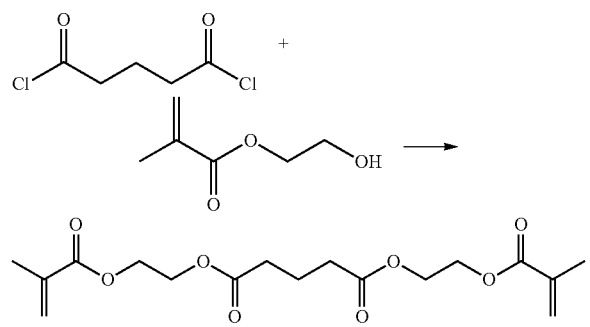

Experimental Procedure:

4 g hydroxyethyl methacrylate was added to 2.585 g glutaryl chloride (97% from ALDRICH). The reaction mixture was stirred over night at room temperature. The major side products as well as non reacted reagents were extracted with an aqueous solution of sodium bicarbonate. The product was extracted with methyl tert-butyl ether and purified by column chromatography using a Prochrom LC80 column, packed with Kromasil Si 60å 10 μm and methylene chloride/ethyl acetate 30/70 as eluent. The compound was analyzed using TLC-chromatography (TLC Silica gel 60 F254; supplied by Merck, eluent: methylene chloride/methanol 90/10, Rf: 0.65).

Synthesis of Compound M-18.

Synthesis of N,N'-Bis(2-hydroxyethyl)-N,N'-dimethyloxalylamide

Reaction scheme:

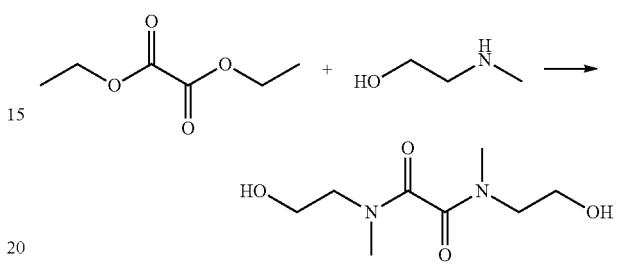

Experimental Procedure:

20.58 g 2-methylamino-1-ethanol was added dropwise to 20 g diethyl oxalate (99% from ACROS). The mixture was stirred over night at room temperature. The formed ethanol was evaporated and the crude product was used without further purification. The compound was analyzed using TLC-chromatography (TLC Silica gel 60 F254; supplied by Merck, eluent: methylene chloride/methanol 90/10, Rf: 0.30).

Compound M-18.

Reaction scheme:

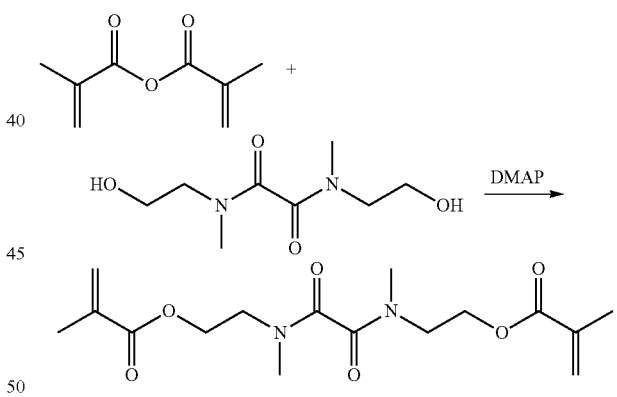

Experimental Procedure:

27.86 g N,N'-Bis(2-hydroxyethyl)-N,N'-dimethyloxalylamide was added to 200 ml of dichloromethane. 57.05 ml triethylamine and 1.67 g 4-dimethylaminopyridine were added to the mixture. 63.02 g methacrylic anhydride (>94% from ALDRICH) was added dropwise to the mixture. The reaction was allowed to continue over night at room temperature under mild stirring. The reaction mixture was evaporated under reduced pressure. The crude product was washed with methanol and successively purified by column chromatography using a Prochrom LC80 column, packed with Kromasil Si 60å 10 μm and methylene chloride/ethyl acetate 30/70 as eluent. The compound was analyzed using TLC-chromatography (TLC Silica gel 60 F254; supplied by Merck, eluent: methylene chloride/methanol 90/10, Rf=0.90).

Example 1

Violet Photopolymer Printing Plates

1. Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l SO42− ions and 5 g/l Al3+ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterised by a surface roughness Ra of 0.35-0.4 µm (measured with interferometer NT1100) and had an anodic weight of 3.0 g/m2.

2. Preparation of the Printing Plates PP-01 to PP-34. Coating

Printing plate precursors PPP-01 to PPP-34 were produced by coating onto the above described support S-01 the components as defined in Table 2 (see below) dissolved in a mixture of 40% by volume of MEK and 60% by volume of Dowanol PM (1-methoxy-2-propanol, commercially available from DOW CHEMICAL Company). The coating solution was applied at a wet coating thickness of 30 µm and then dried at 120° C. for 1 minute in a circulation oven.

TABLE 2 dry coating weight of the photopolymerisable layer PL-01.

| INGREDIENT* | PL-01 g/m² |
|---|---|
| Fluomix (1) | 0.075 |
| PVA (2) | 0.225 |
| Polymerisable compound (3) and/or inventive compound (4) | 0.900 |
| Tegoglide 410 (5) | 0.00225 |
| HABI (6) | 0.1125 |
| Pig-disp-01 (7) | 0.180 |
| MBT (8) | 0.030 |
| Albritect CP30 (9) | 0.036 |
| Sipomer PAM100 (10) | 0.195 |
| Dry coating weight | 1.7558 |

*active components in the coating (1) Fluomix is a violet sensitizer mixture consisting of the following compounds:

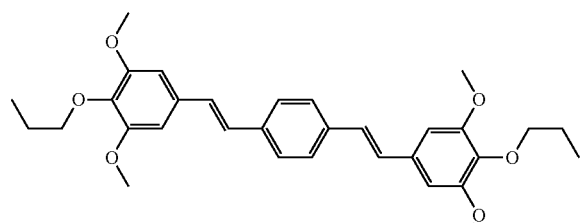

15 wt. %

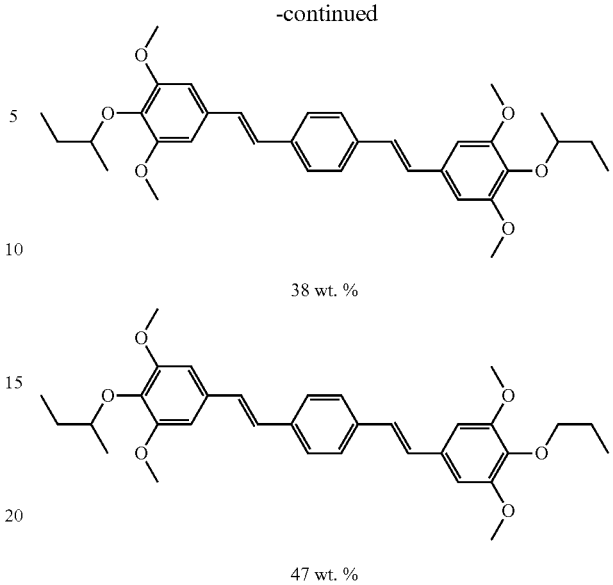

38 wt. %

47 wt. %

(2) PVA is a poly(vinyl acetate) with Mw=500.000 commercially available from ALDRICH;
(3) Polymerisable Compounds as given in Table 1 above and present in the coating in an amount specified in Table 3 below;
(4) Inventive Compounds as synthesized above and present in the coating in an amount specified in Table 3 below;
(5) Tegoglide 410™ is a surfactant commercially available from Evonik Tego Chemie GmbH;
(6) HABI is 2,2'-bis(o-chlorophenyl)-4,4',5,5'-tetraphenylbiimidazole commercially available from SUMITOMO;
(7) Pig-disp-01 contains in a 50/50 ratio Hostaperm Blue P-BFS™ commercially available from Clariant and Disperbyk 182 commercially available from BYK Chemie GmbH;
(8) MBT is 2-mercaptobenzthiazole;
(9) Albritect CP30 is a poly(acrylic acid) poly(vinylphosphonic acid) 70/30 copolymer from RHODIA;
(10) Sipomer PAM100 is a phosphate ester of polyethylene glycol monomethacrylate from RHODIA.

TABLE 3

Printing plate precursors PPP-01 to PPP-34

| Printing plate Precursors | Inventive compound | mg/m² | % wt | Polymerisable compound | mg/m² |
|---|---|---|---|---|---|
| PPP-01 comparative | — | 0 | 0 | M-1 | 600 |
| PPP-02 comparative | COMP-2 | 60 | 5.1 | M-1 | 540 |
| PPP-03 comparative | COMP-2 | 90 | 7.7 | M-1 | 510 |
| PPP-04 comparative | COMP-2 | 105 | 9.0 | M-1 | 495 |
| PPP-05 inventive | COMP-2 | 120 | 10.3 | M-1 | 480 |
| PPP-06 inventive | COMP-2 | 210 | 17.9 | M-1 | 390 |
| PPP-07, inventive | COMP-2 | 300 | 25.6 | M-1 | 300 |
| PPP-08, inventive | COMP-2 | 390 | 33.3 | M-1 | 210 |
| PPP-09, comparative | COMP-2 | 480 | 41.0 | M-1 | 120 |
| PPP-10 inventive | COMP-3 | 150 | 12.8 | M-1 | 450 |
| PPP-11 inventive | COMP-4 | 150 | 12.8 | M-1 | 450 |
| PPP-12 comparative | — | — | — | M-1 | 600 |
| PPP-13 comparative | — | — | — | M-3 | 600 |
| PPP-14 comparative | — | — | — | M-4 | 600 |
| PPP-15 comparative | — | — | — | M-5 | 600 |
| PPP-16 comparative | — | — | — | M-6 | 600 |
| PPP-17 comparative | — | — | — | M-7 | 600 |
| PPP-18 comparative | — | — | — | M-9 | 600 |
| PPP-19 comparative | — | — | — | M-10 | 600 |
| PPP-20 comparative | — | — | — | M-11 | 600 |

TABLE 3-continued

Printing plate precursors PPP-01 to PPP-34

| Printing plate Precursors | Inventive compound | mg/m² | % wt | Polymerisable compound mg/m² |
|---|---|---|---|---|
| PPP-21 comparative | — | — | — | M-12 600 |
| PPP-22 comparative | — | — | — | M-13 600 |
| PPP-23 comparative | — | — | — | M-14 600 |
| PPP-24 comparative | — | — | — | M-15 600 |
| PPP-25 comparative | — | — | — | M-16 600 |
| PPP-26 comparative | — | — | — | M-6 + M-1 150 + 450 |
| PPP-27 comparative | — | — | — | M-7 + M-1 150 + 450 |
| PPP-28 comparative | — | — | — | M-8 + M-1 150 + 450 |
| PPP-29 comparative | — | — | — | M-9 + M-1 150 + 450 |
| PPP-30 comparative | — | — | — | M-10 + M-1 150 + 450 |
| PPP-31 comparative | — | — | — | M-11 + M-1 150 + 450 |
| PPP-32 comparative | — | — | — | M-17 + M-1 300 + 300 |
| PPP-33 comparative | — | — | — | M-3 + M-1 300 + 300 |
| PPP-34 comparative | — | — | — | M-18 + M-1 150 + 450 |

Sensitivity Results

Evaluation of the sensitivity of the overcoat-free printing plate precursors PPP-1 to PPP-34.

Exposure was carried out on an Agfa Polaris X violet platesetter at 1270 dpi through an UGRA Step Wedge (wedge constant of 0,15). The sensitivity, i.e. right exposure, was determined for each printing plate precursor. The sensitivity is defined as the exposure energy density (in µJ/cm2) needed to obtain an optical density >97% of the maximum optical density that can be obtained on this plate after processing on the first three wedge steps. The obtained sensitivity results are given in Table 4.

TABLE 4

Sensitivity results of the printing plate precursors PPP-01 to PPP-34.

| Printing plate precursors | Sensitivity µJ/cm² |
|---|---|
| PPP-01, comparative | no image |
| PPP-02, comparative | no image |
| PPP-03, comparative | very weak image |
| PPP-04, comparative | very weak image |
| PPP-05, inventive | 150 |
| PPP-06, inventive | 142 |
| PPP-07, inventive | 127 |
| PPP-08, inventive | 350 |
| PPP-09, comparative | no image |
| PPP-10, inventive | 148 |
| PPP-11, inventive | 105 |
| PPP-12 to PPP-34, comparative | no image |

The results in Table 4 show that the overcoat-free printing plate precursors containing the inventive compound at a concentration above 10% wt and below 40% wt provide printing plate precursors with excellent sensitivity;

the overcoat-free printing plate precursors containing a coating without the inventive compound (PPP-12 to PPP-34) do not provide an image.

Evaluation of the sensitivity of the printing plate precursors PPP-35 to PPP-40 with a toplayer.

Preparation of the Printing Plate Precursors.

Coating

Printing plate precursors PPP-35 to PPP-40 were produced by first coating onto the above described support S-01 the components as defined in Table 5 (see below) dissolved in a mixture of 40% by volume of MEK and 60% by volume of Dowanol PM (1-methoxy-2-propanol, commercially available from DOW CHEMICAL Company). The coating solution was applied at a wet coating thickness of 30 µm and then dried at 120° C. for 1 minute in a circulation oven.

TABLE 5 dry coating weight of the photopolymerisable layer PL-01.

| INGREDIENT* | PL-01 g/m² |
|---|---|
| Fluomix (1) | 0.075 |
| PVA (2) | 0.225 |
| Inventive compound and polymerisable compound (3) | 0.900 |
| Tegoglide 410 (4) | 0.00225 |
| HABI (5) | 0.1125 |
| Pig-disp-01 (6) | 0.180 |
| MBT (7) | 0.030 |
| Albritect CP30 (8) | 0.036 |
| Sipomer PAM100 (9) | 0.195 |
| Dry coating weight | 1.7558 |

*active components in the coating (1), (2), (4), (5), (6), (7), (8) and (9): see Table 1 above; (3) Compounds as synthesized above and combined as defined in Table 6 below;

TABLE 6

Printing plate precursors PPP-35 to PPP-40.

| Printing plate precursor | Inventive compound (mg/cm²) | Comparative polymerisable compound (mg/cm²) |
|---|---|---|
| PPP-35, comparative | — | M-1 (600) |
| PPP-36, inventive | COMP-4 (150) | M-1 (450) |
| PPP-37, inventive | COMP-6 (150) | M-1 (450) |
| PPP-38, inventive | COMP-8 (150) | M-1 (450) |
| PPP-39, inventive | COMP-9 (150) | M-1 (450) |
| PPP-40, inventive | COMP-10 (150) | M-1 (450) |

Toplayer

On top of the photosensitive layer a solution in water with the composition as defined in Table 7 was coated (40 µm) and subsequently dried at 120° C. for 2 minutes. The so-formed protective toplayer OC-1 has a dry coating weight of 1.25 g/m². Printing plate precursors PPP-35 to PPP-40 provided with a toplayer were obtained.

TABLE 7

Composition of the toplayer solution OC-01.

| INGREDIENT (g) | OC-01 |
|---|---|
| Mowiol 4-88 (1) | 19.1 |
| Mowiol 8-88 (1) | 5.84 |
| Luviskol K30 (2) | 5.95 |
| Acticide LA1206 (3) | 0.06 |
| Lutensol A8 (4) | 0.30 |
| Water | 969 |

* active components in the coating (1) Mowiol 4-88™ and Mowiol 8-88™ are partially hydrolyzed polyvinylalcohols commercially available from Kuraray;

(2) Luviskol K30™ is polyvinylpyrrolidone homopolymer commercially available from BASF;
(3) Acticide LA1206™ is a biocide commercially available from Thor;
(4) Lutensol A8™ is a surface active agent commercially available from BASF.

Sensitivity Results

The sensitivity of the obtained printing plate precursors PPP-35 to PPP-40 was determined (as described above) and the results are summarized in Table 8 below.

TABLE 8

Sensitivity results of the printing plate precursors PPP-35 to PPP-40.

| Printing plate precursor with a toplayer | Sensitivity $\mu J/cm^2$ |
|---|---|
| PPP-35, comparative | 150 |
| PPP-36, inventive | 79 |
| PPP-37, inventive | 91 |
| PPP-38, inventive | 77 |
| PPP-39, inventive | 87 |
| PPP-40, inventive | 86 |

Processing

After imaging, the printing plate precursors were subjected to processing with Gum-1 (see below) in a CRF45 processor (dwell time 30 s, at 21° C.), available from Agfa Graphics, to remove the coating in the non-image areas from the support. Printing plates PP-01 to PP-40 are obtained.

Gum-1 is a solution prepared as follow:
To 650 ml demineralised water
67 ml of Emulsogen TS 160™, a non-ionic surfactant commercially available from Clariant;
21.21 ml sodium n-octyl sulfate, commercially available from Henkel as a 42% solution in water;
70 g of potato dextrine Avedex 37, commercially available Avebe BA;
5 g of potassium hydrogen phosphate;
2.35 g of sodium hydroxide (50 wt % aqueous solution) and
9.5 ml phenoxypropanol, commercially available from BASF
were added under stirring and demineralised water was further added to make 1000 ml.
The pH is 7 at room temperature.

Accelerated Press Life Test

The accelerated press life test as described below was performed on printing plates PP-05 and PP-07 as described above and on PP-35 (with a toplayer). Since the Comparative Examples do not result in an image without a toplayer (see Table 4 above), the evaluation of the accelerated press life of the Comparative Example was performed with a toplayer. The Inventive Examples were performed without a toplayer.

Procedure for the Accelerated Presslife Test:

A test field consisting of several patterns such as a uniform dot pattern with a theoretical dot coverage of 40% (at 200 lpi) was exposed on each printing plate at the right exposure in order to evaluate the dot loss on the printed sheet during printing. Printing was conducted on a Heidelberg GTO046 sheetfed Press™ (available from Heidelberger Druckmaschinen AG) up to 30000 impressions, using a compressible rubber blanket ContiAir Entropia HC (trademark of Continental), K+E Novavit 800 Skinnex ink (trademark of BASF), to which 0.5 wt % of 15 micron CaCO3 particles (K4Plus obtained from Manroland Benelux NV) was added, and 2% Agfa Prima FS404 fountain solution additive (trademark of Agfa Graphics). The dotloss % is a measure for the abrasive wear of the plate during printing and is defined as the difference between the dot coverage of the 40% pattern on printed page 1000 and the dot coverage of the 40% pattern on page 30000, divided by the dot coverage on page 1000, multiplied by 100. A high value of dotsize loss after the 30000 impressions reflects a high occurrence of abrasive wear on the plate during the test.

The accelerated presslife test results obtained for the inventive and comparative printing plates are given in Table 9.

TABLE 9

Results of the accelerated presslife test.

| Printing plate | toplayer present before processing | Sensitivity ($\mu J/cm^2$) | Dotsize loss after accelerated presslife testing (%) |
|---|---|---|---|
| PP-05 Inventive | no | 150 | 15 |
| PP-07 Inventive | no | 150 | 20 |
| PP-35 Comparative | yes | 150 | 55 |

The results of the accelerated presslife test show that the inventive printing plates which were not provided with a toplayer are characterized by—compared to the comparative printing plate which was provided with a toplayer—a significant improved presslife.

IV. Example 2

Thermal Photopolymer Printing Plates

Preparation of the Printing Plates PP-41 to PP-43

Coating

The printing plate precursors PPP-41 to PPP-43 were prepared by coating onto the above described support S-01 the components as defined in Table 10 below dissolved in a mixture of 40% by volume of MEK and 60% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 10

Composition and dry coating weight of the photopolymerisable layer PL-02.

| INGREDIENT* | PL-02 g/m² |
|---|---|
| IR dye (1) | 0.033 |
| Poly(vinyl acetaat)(2) | 0.225 |
| Inventive compound and/or (3) Polymerisable compound (4) | 0.900 |
| Tegoglide 410 (5) | 0.00225 |
| 131725-16-1 (6) | 0.090 |
| Pig-disp-01 (7) | 0.180 |
| Albritect CP30 (8) | 0.036 |
| Sipomer PAM100 (9) | 0.195 |
| Dry coating weight | 1.6613 |

*active components in the coating (1) IR dye is an infrared absorbing dye commercially available from FEW CHEMICALS and has the following structure:

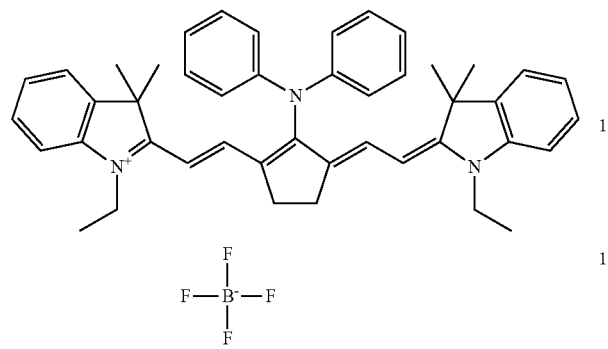

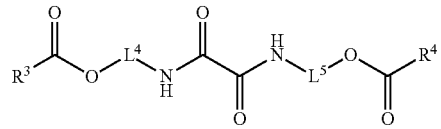

(2), (5), (7), (8) and (9): See Table 1;
(3) Polymerisable Compounds as given in Table 1 above and present in the coating in an amount specified in Table 10 below;
(4) Inventive Compounds as synthesized above and present in the coating in an amount specified in Table 11 below;
(6) Bis (4-tert-butylphenyl) iodonium tetraphenylborate from HAMPFORD RESEARCH.

Sensitivity Results

Evaluation of the sensitivity of the printing plate precursors PPP-41 to PPP-43.

Exposure was carried out on a Creo 3244T thermal platesetter at 2400 dpi. The sensitivity, i.e. right exposure, was determined for each printing plate precursor. The sensitivity is defined as the exposure energy density (in mJ/cm2) needed to obtain (after processing) a dotgain value of 1 to 1.5% on a pattern consisting of (theoretical) 30% dot coverage.

TABLE 11

Sensitivity results of the overcoat-free printing plate precursors.

| Printing plate precursor | Inventive compound (mg/cm$^2$) | Polymerisable compound (mg/cm$^2$) | Sensitivity (mJ/cm$^2$) |
|---|---|---|---|
| PPP-41 Inventive | COMP-1 (120) | M-3 (480) | 30 |
| PPP-42 comparative | — | M-1 (600) | No image |
| PPP-43 comparative | — | M-3 (600) | No image |

The results show that the overcoat-free printing plate precursors PPP-42 and PPP-43 which do not contain the inventive compound do not provide an image. The inventive, overcoat-free printing plate precursor PPP-41 containing a coating including a compound according to the present invention provides a printing plate precursor with an excellent sensitivity.

The invention claimed is:
1. A lithographic printing plate precursor comprising:
   a support including a hydrophilic surface or a hydrophilic layer; and
   a coating including a photopolymerizable layer; wherein the coating includes a compound represented by Formula (IV):

$$R^3-O \overset{O}{\underset{}{\|}} -L^4-\overset{H}{\underset{H}{N}} \overset{O}{\underset{}{\|}} \overset{O}{\underset{}{\|}} \overset{H}{\underset{}{N}}-L^5-O \overset{O}{\underset{}{\|}} -R^4$$

wherein
$R^3$ and $R^4$ independently represent a terminal group;
$L^4$ and $L^5$ independently represent a divalent linking group; and
the compound according to Formula IV is present in an amount above 10% wt and below 40% wt relative to a total dry weight of ingredients of the coating.

2. The precursor according to claim 1, wherein the divalent linking groups $L^4$ and $L^5$ independently represent an optionally substituted alkylene, an optionally substituted cycloalkylene, an optionally substituted arylene, an optionally substituted heteroarylene, —O—, —CO—, —CO—O—, —O—CO—, —CO—NH—, —NH—CO—, —NH—CO—O—, —O—CO—NH—, —NH—CO—NH—, —NH—CS—NH—, —CO—NR'—, —NR"—CO—, —NH—CS—NH—, —SO—, —SO$_2$—, —SO$_2$—NH—, —NH—SO$_2$—, —CH=N—, —NH—NH—, —N$^+$(CH$_3$)$_2$, —S—, —S—S—, or combinations thereof.

3. The precursor according to claim 1, wherein the divalent linking groups $L^4$ and $L^5$ independently represent an optionally substituted alkylene or an optionally substituted cycloalkylene group.

4. The precursor according to claim 1, wherein the terminal groups $R^3$ and $R^4$ independently represent hydrogen, an optionally substituted alkyl, an optionally substituted cycloalkyl group, an optionally substituted aryl group, an optionally substituted aralkyl group, or an optionally substituted heteroaryl group.

5. The precursor according to claim 1, wherein the precursor does not include a protective overcoat layer.

6. A method of making a lithographic printing plate comprising the steps of:
   providing a lithographic printing plate precursor according to claim 1;
   image-wise exposing the precursor with a laser emitting IR-light or violet light;
   developing the precursor off-press by treating the precursor with a gum solution to remove non-exposed areas of the coating from the support and to develop and gum the precursor in one single step.

* * * * *